(12) United States Patent
Furusawa (10) Patent No.: US 6,660,545 B2
(45) Date of Patent: Dec. 9, 2003

(54) SEMICONDUCTOR DEVICE AND MANUFACTURING METHOD THEREFOR, CIRCUIT SUBSTRATE, AND ELECTRONIC APPARATUS

(75) Inventor: Masahiro Furusawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 10/095,690

(22) Filed: Mar. 13, 2002

(65) Prior Publication Data

US 2002/0151171 A1 Oct. 17, 2002

(30) Foreign Application Priority Data

Mar. 28, 2001 (JP) .......................... 2001-093926
Mar. 12, 2002 (JP) .......................... 2002-067725

(51) Int. Cl.[7] ............................................. H01L 21/00
(52) U.S. Cl. ............................. 438/21; 438/52; 438/53
(58) Field of Search ............................. 438/21, 52, 53; 29/829

(56) References Cited

U.S. PATENT DOCUMENTS

| 5,832,595 A | * | 11/1998 | Maruyama et al. ............ 29/829 |
| 6,123,863 A | * | 9/2000 | Shimomura et al. ........... 216/27 |
| 6,123,876 A | * | 9/2000 | Kobayashi et al. ....... 252/519.2 |
| 6,353,280 B1 | * | 3/2002 | Shibata et al. ............... 313/292 |
| 6,426,733 B1 | * | 7/2002 | Yamada ....................... 345/74.1 |
| 6,465,742 B1 | * | 10/2002 | Hiraoka et al. .............. 174/255 |

* cited by examiner

*Primary Examiner*—Matthew Smith
*Assistant Examiner*—V. Yevsikov
(74) *Attorney, Agent, or Firm*—Oliff & Berridge, PLC (57) ABSTRACT

A device and manufacturing method for a semiconductor device includes the steps of forming a penetration hole 50 in a semiconductor chip 10 having an electrode 14, and forming a conductive layer 70 in the region including the inside of the penetration hole 50. Regarding the penetration hole 50, an intermediate portion is formed to be larger than an open end portion, and the conductive layer 70 is formed by applying a coating of a liquid containing metal fine particles by an ink-jet method.

21 Claims, 11 Drawing Sheets

SEMICONDUCTOR DEVICE AND MANUFACTURING METHOD THEREFOR, CIRCUIT SUBSTRATE, AND ELECTRONIC APPARATUS

TECHNICAL FIELD OF THE INVENTION

The present invention relates to a semiconductor device and a manufacturing method therefor, a circuit substrate, and electronic apparatus.

BACKGROUND ART

In recent years, semiconductor devices have been developed, in which a plurality of semiconductor chips are laminated. The majority thereof have been those in which bonding of a wire or a lead to an electrode of the semiconductor chip is performed for the sake of electrical connection. However, since the wire, etc., have been provided, there has been a limitation in miniaturization. It has also been developed to perform electrical connection by forming a penetration hole in a semiconductor chip and filling the penetration hole with molten solder. However, when a narrow penetration hole is filled with solder, a void is generated and, therefore, reliability in electrical connection is unlikely to be ensured.

The present invention is to overcome this problem. It is an object of the present invention to provide a semiconductor device and a manufacturing method therefor, in which electrical connection can be performed with high reliability and with ease.

DISCLOSURE OF INVENTION

In order to overcome the aforementioned problem, the present invention provides a thin film forming method, in which, regarding a method for forming a thin film by a chemical vapor deposition method, a liquid containing a material for the thin film is placed on a part of or parts of a substrate, the material for the thin film is vaporized from this liquid so as to be supplied to a part of or parts of a thin-film forming surface and, therefore, the thin film is formed on the thin-film forming surface with a predetermined pattern.

BRIEF DESCRIPTION OF THE DRAWINGS

FIG. 1(A) to FIG. 1(C) are diagrams showing a manufacturing method for a semiconductor device according to an embodiment to which the present invention is applied.

FIG. 2(A) to FIG. 2(C) are diagrams showing the manufacturing method for the semiconductor device according to the embodiment to which the present invention is applied.

FIG. 3(A) to FIG. 3(C) are diagrams showing the manufacturing method for the semiconductor device according to the embodiment to which the present invention is applied.

FIG. 4(A) to FIG. 4(C) are diagrams showing the manufacturing method for the semiconductor device according to the embodiment to which the present invention is applied.

FIG. 5(A) to FIG. 5(C) are diagrams showing the manufacturing method for the semiconductor device according to the embodiment to which the present invention is applied.

FIG. 8(A) to FIG. 8(C) are diagrams showing the manufacturing method for the semiconductor device according to the embodiment to which the present invention is applied.

BEST MODE FOR CARRYING OUT THE INVENTION

A manufacturing method for a semiconductor device according to the present invention includes a first step of forming a penetration hole in a semiconductor element having an electrode and a second step of forming a conductive layer in the region including the inside of the penetration hole, wherein the manufacturing method for the conductive layer includes the affirmation of coating a part of the semiconductor element with a liquid containing metal fine particles by an ink-jet method and the step of converting the liquid into the conductive layer by a heat treatment.

According to the present invention, electrical connection of one surface of the semiconductor element and the other surface is performed by coating the inside of the penetration hole with the liquid containing the metal fine particles and converting the liquid to the conductive layer by a heat treatment. Therefore, since only the conductive layer is formed, and the penetration hole is not filled with a molten material, the problem of void formation does not occur and, therefore, high reliability in electrical connection can be ensured. Furthermore, since a coating of the liquid is applied to only required parts by the ink-jet method, the process can be simplified and the usage amount of the material can be reduced.

Examples of embodiments thereof include, for example, the following modes.

(1) In this manufacturing method for the semiconductor device, a hole communicated with the penetration hole may be formed in the electrode, and the conductive layer may be formed while being laminated on at least a part of the electrode. According to this, the conductive layer can be formed while being electrically connected to the electrode.

(2) In this manufacturing method for the semiconductor device, the penetration hole may be formed in the shape including an open end portion and an intermediate portion having a diameter larger than that of the open end portion. According to this, since the intermediate portion of the penetration hole has a large diameter, the conductive layer is likely to be formed.

(3) In this manufacturing method for the semiconductor device, the intermediate portion may be formed such that all parts have nearly the same diameter, and the penetration hole may be formed in the shape further including a taper portion connecting the open end portion and the intermediate portion. According to this, since all parts of the intermediate portion have nearly the same diameter, stress is applied evenly and, therefore, reduction of strength of the semiconductor element due to formation of the penetration hole can be suppressed.

(4) In this manufacturing method for the semiconductor device, in the first step, a small hole having a diameter smaller than that of the penetration hole may be formed in advance, and the small hole may be enlarged so as to form the penetration hole. According to this, the small hole can be formed with energy smaller than that in the formation of the penetration hole and, therefore, the energy for forming the penetration hole can be reduced by forming the small hole in advance.

(5) In this manufacturing method for the semiconductor device, in the first step, a dent may be formed at the position at which the penetration hole is to be formed, and the small hole may be formed in accordance with positioning based on the dent. According to this, since the position, at which the penetration hole is to be formed, can be ascertained by the dent, the penetration hole can be formed at a precise position.

(6) In this manufacturing method for the semiconductor device, the small hole may be formed with a laser beam, and the small hole may be enlarged by wet etching. According to this, the penetration hole can be formed with ease. Even when the inner wall surface of the small hole formed with the laser beam have been roughened, since this is enlarged by wet etching, the penetration hole having a smooth inner wall surface can be formed.

(7) In this manufacturing method for the semiconductor device, the step of forming an electrical-connection portion may be included.

(8) In this manufacturing method for the semiconductor device, the connection portion may be formed as a part of the conductive layer in the second step.

(9) In this manufacturing method for the semiconductor device, the step of forming an insulating film on the inner wall surface of the penetration hole may be further included after the first step and before the second step, and the conductive layer may be formed on the insulating film in the second step.

(10) In this manufacturing method for the semiconductor device, the insulating film may be formed by chemical vapor deposition.

(11) In this manufacturing method for the semiconductor device, a surface treatment, in which the region with no coating of the liquid is made liquid-repellent against the liquid, may be performed after the first step and before the second step. According to this, when the liquid is ejected by the ink-jet method, even if curving of liquid droplets occur by a small degree, all liquid droplets fall within lyophilic parts and, therefore, coating precision is improved.

(12) In this manufacturing method for the semiconductor device, the surface treatment may be an atmospheric plasma treatment. According to this, the surface treatment can be performed by a simplified process.

(13) In this manufacturing method for the semiconductor device, the surface treatment may be the one in which a self-organizing film is formed on the surface. According to this, the surface treatment can be performed with low energy.

(14) In this manufacturing method for the semiconductor device, the semiconductor element may be a semiconductor chip.

(15) In this manufacturing method for the semiconductor device, the semiconductor element may be a part of a semiconductor wafer.

(16) The manufacturing method for the semiconductor device according to the present invention may include the step of laminating the semiconductor devices manufactured by the aforementioned method, and electrically connecting the conductive layers in the upper and lower semiconductor devices.

Three-dimensional mounting is applied to this manufacturing method for the semiconductor device.

(17) In this manufacturing method for the semiconductor device, the step of cutting the semiconductor wafer into individual pieces may be included.

(18) A semiconductor device according to the present invention is the one manufactured by the aforementioned method.

(19) A circuit substrate according to the present invention is configured by mounting the semiconductor device manufactured by the aforementioned method.

(20) Electronic apparatus according to the present invention includes the semiconductor device manufactured by the aforementioned method.

Embodiments according to the present invention will be described below with reference to the drawings.

Embodiments of the Invention

Figure 1:
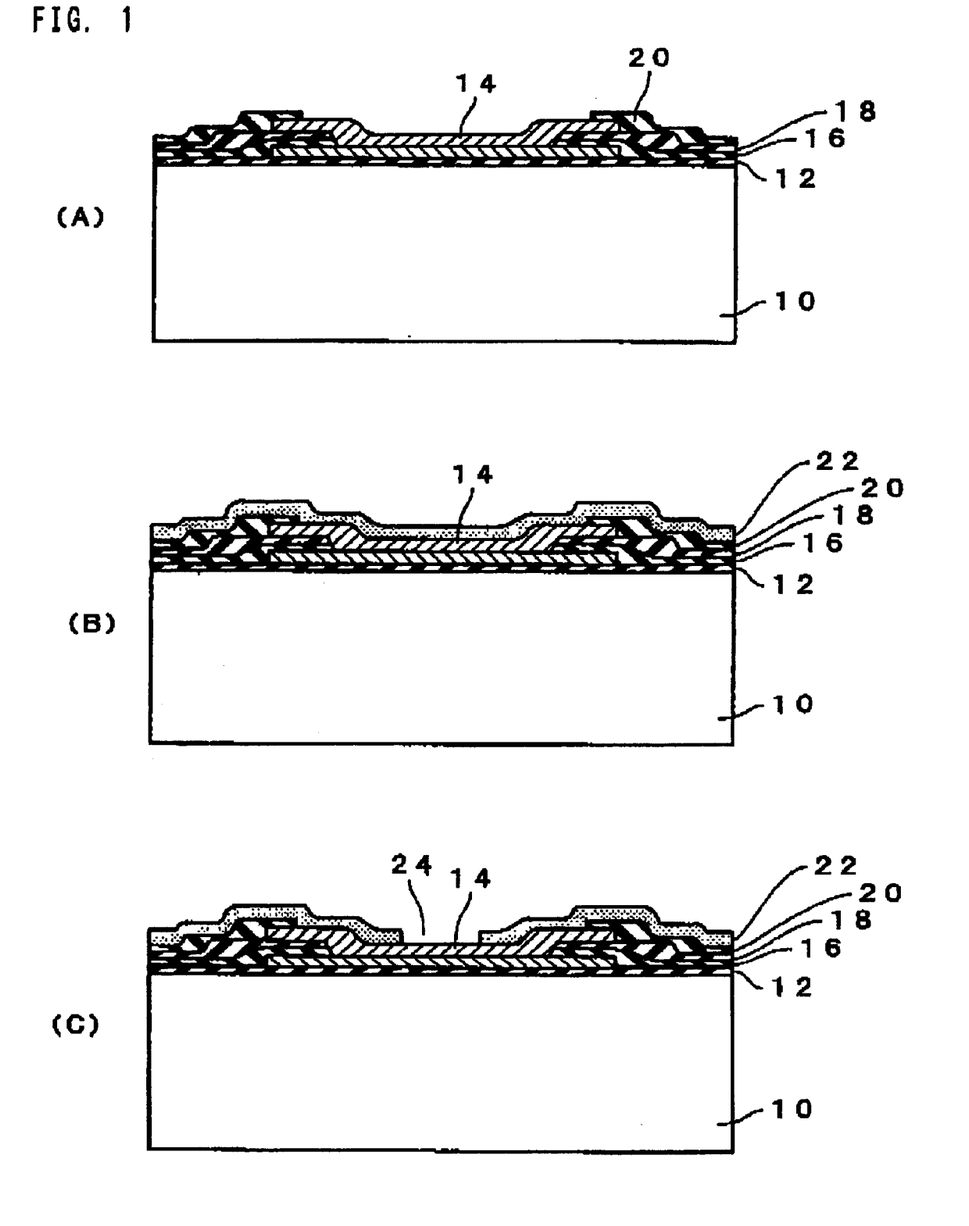

Preferred embodiments according to the present invention will be described below with reference to the drawings. FIG. 1(A) is a diagram showing a part of a semiconductor chip 10 used in the present embodiment. In general, the semiconductor chip 10 is a rectangular parallelepiped (including a cube). However, the shape thereof is not limited, and may be the shape of a sphere.

The semiconductor chip 10 includes an insulating film (interlayer film) 12 on the surface on which an integrated circuit, although not shown in the drawing, composed of transistors, memory elements, etc., is formed. In many cases, the insulating film 12 is an oxide film of silicon which is a basic material for the semiconductor chip 10. An electrode (pad) 14 is formed on the insulating film 12, and the electrode 14 is electrically connected to the integrated circuit at the part not shown in the drawing. In many cases, the electrode 14 is formed from aluminum. The electrode 14 is aligned along at least one side (in many cases, two sides or four sides) of the surface of the semiconductor chip 10. The electrode 14 may be aligned at the edge portion of the semiconductor chip 10, or be aligned at the center portion.

The electrode 14 is configured in accordance with the manufacturing process of the integrated circuit. For example, in an example shown in FIG. 1(A), on the insulating film 12, the lower portion of the electrode 14 is formed, insulating films 16 and 18, which are placed on the end portion of the lower portion, are formed, and the upper portion of the electrode 14 is formed while getting on the insulating film 18. A passivation film 20 is formed while covering the end portion of the electrode 14 except the center portion. The passivation film 20 can be formed from, for example, $SiO_2$, SiN, and polyimide resin.

In the present embodiment, a semiconductor device is manufactured using the aforementioned semiconductor chip 10 by the following method.

As shown in FIG. 1(B), a resist 22 is formed on the surface, on which the electrode 14 has been formed, of the semiconductor chip 10. As the method for forming the resist 22, a spin coating method, dipping method, spray coating method, etc., can be used. The resist 22 is formed while covering the electrode 14 as well. The resist 22 is to cover the part which is not etched during an etching step described below. The resist 22 may be any one of a photoresist, electron beam resist, and X-ray resist, and be either of positive type or of negative type. The resist 22 used in the present embodiment is a positive type photoresist. In order to prevent adhesion to other members, the resist 22 is pre-baked to remove a solvent after coating is performed.

As shown in FIG. 1(C), the resist 22 is patterned. For details, a mask is placed on the resist 22, and energy radiates. The energy varies depending on the property of the resist 22, and is one of light, electron beam, and X-ray. In the present embodiment, the resist 22 is exposed. The shape of the mask is determined depending on the shape to be patterned, and the shape is reversed depending on the resist 22 being of positive type or of negative type.

After exposure, the resist 22 is developed and is post-baked. An opening portion 24 for exposing the center portion of the electrode 14 has been formed in the resist 22 patterned.

Figure 2:
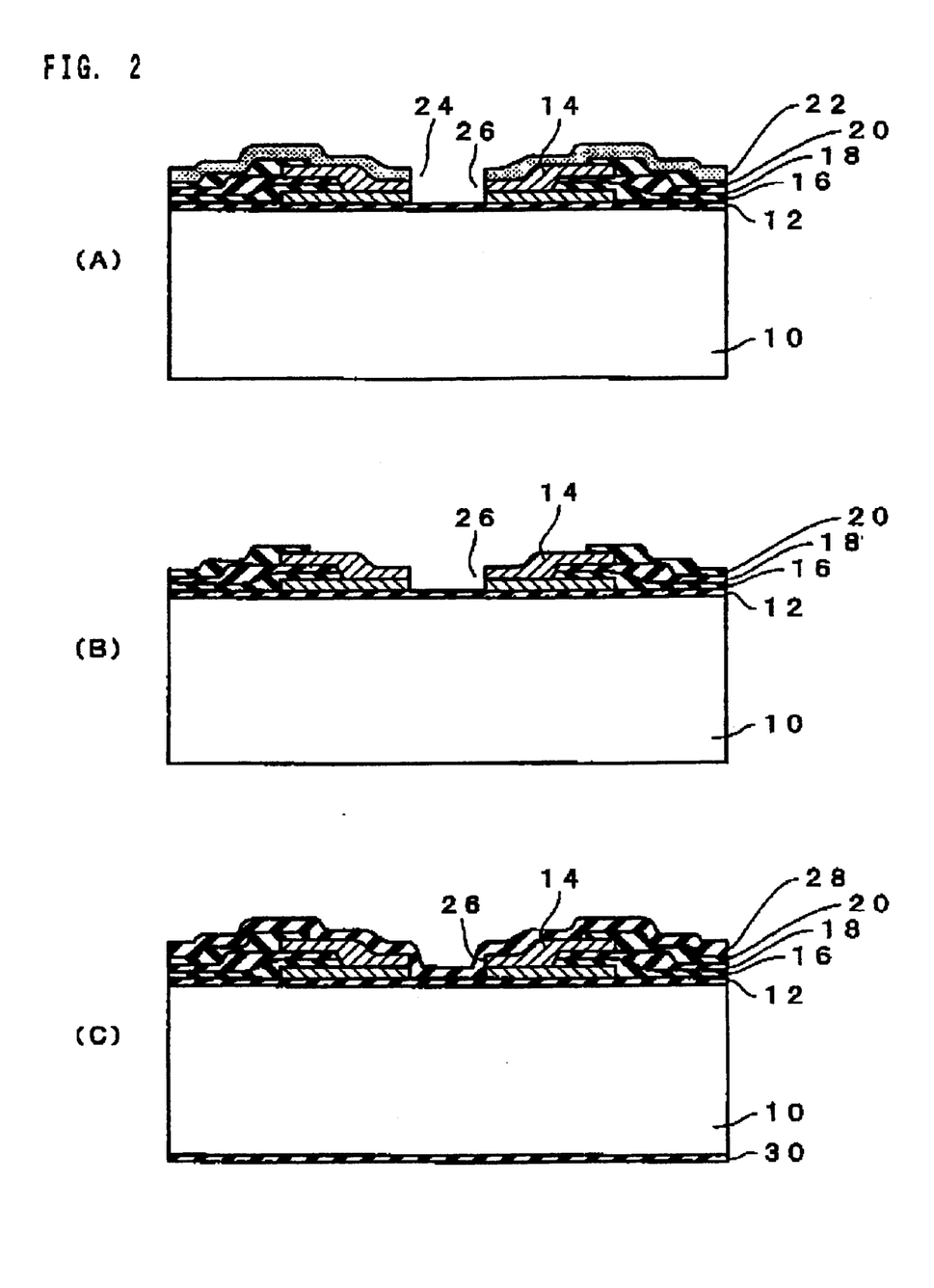

As shown in FIG. 2(A), the center portion of the electrode 14 exposed by the opening portion 24 of the resist 22 is etched. Dry etching is preferably applied as the etching. The dry etching may be reactive ion etching (RIE). Wet etching may be applied as the etching. Consequently, a hole 26 is formed at the center portion (the portion except the end portion) of the electrode 14. The hole 26 is formed at the position of a penetration hole 50 described below. For details, the hole 26 is formed in a size nearly equivalent to or more than that of the open end portion of the penetration hole 50, and is communicated with the penetration hole 50.

As shown in FIG. 2(B), the resist 22 is peeled off. Subsequently, as shown in FIG. 2(C), insulating films 28 and 30 are formed on the side, on which the electrode 14 has been formed, of the semiconductor chip 10 and the other side thereof. The insulating film 28 may be a silicon oxide film or nitride film, and can be formed by chemical vapor deposition (CVD). The insulating film 28 covers the electrode 14 and the passivation film 20. Since the hole 26 has been formed in the electrode 14, the insulating film 28 covers the inside (inner wall surface and the insulating film 12 exposed) of the hole 26 as well.

Figure 3:
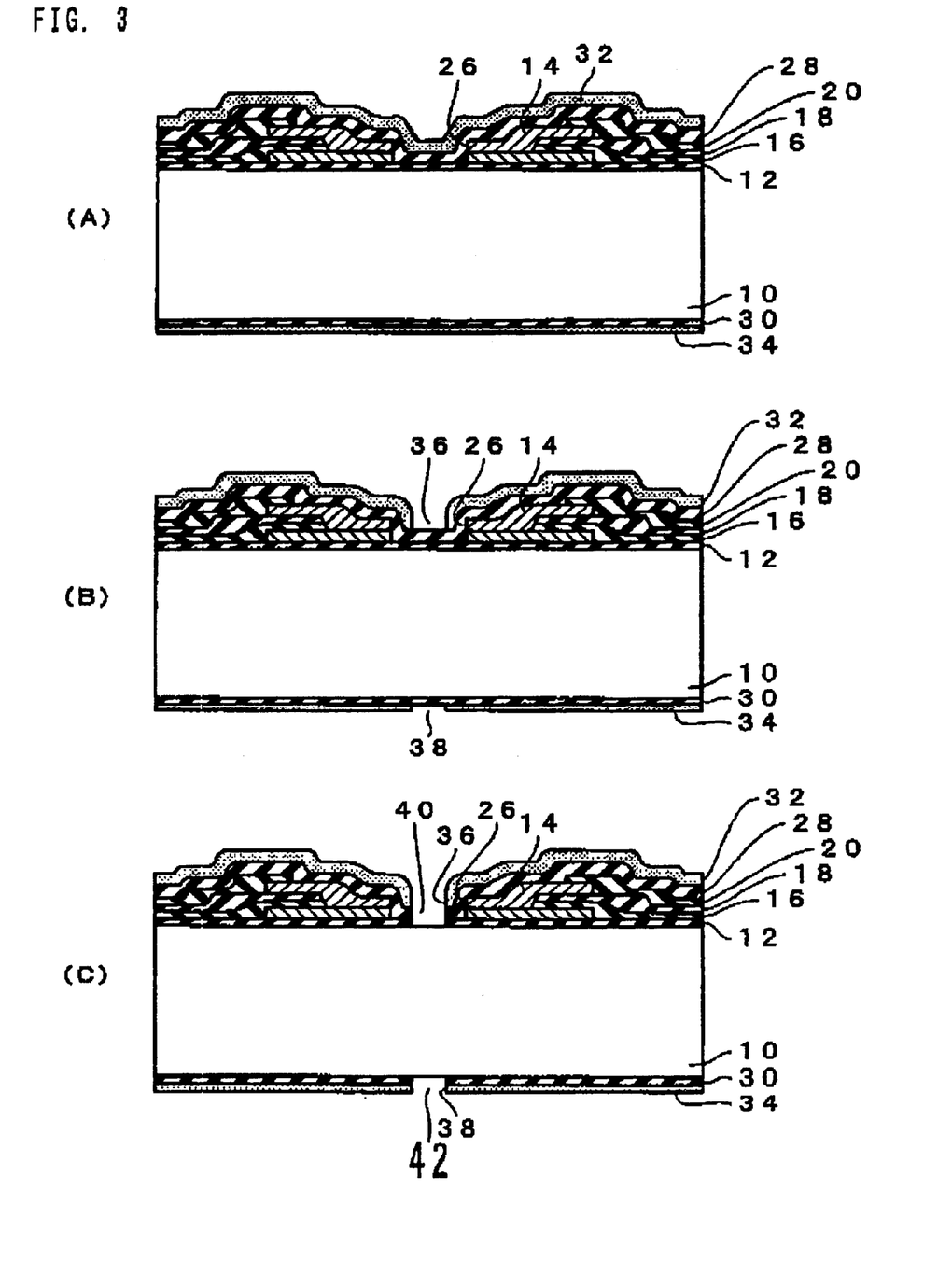

As shown in FIG. 3(A), resists 32 and 34 are formed on the side, on which the electrode 14 has been formed, of the semiconductor chip 10 and the other side thereof. The content of the aforementioned explanation regarding the resist 22 is applied to the resist 32 and 34. One of the resist 32 and 34 (for example, the resist 32) may be formed (for example, on the side, on which the electrode 14 has been formed, of the semiconductor chip 10) and be pre-baked and, thereafter, the other (for example, the resist 34) may be formed and be pre-baked.

As shown in FIG. 3(B), the resist 32 and 34 are patterned so as to form opening portions 36 and 38 at the position of the penetration hole 50 described below. The opening portion 36 is formed inside the hole 26 of the electrode 14. The insulating film 28 exists between the hole 26 and the opening portion 36. The opening portions 36 and 38 expose a part of the insulating films 28 and 30. The content of the aforementioned explanation regarding the resist 22 can be applied to the patterning method for the resists 32 and 34.

As shown in FIG. 3(C), a hole 40 is formed in the insulating films 12 and 28 while being inside the hole 26 of the electrode 14, and a hole 42 is formed in the insulating film 30.

Figure 4:
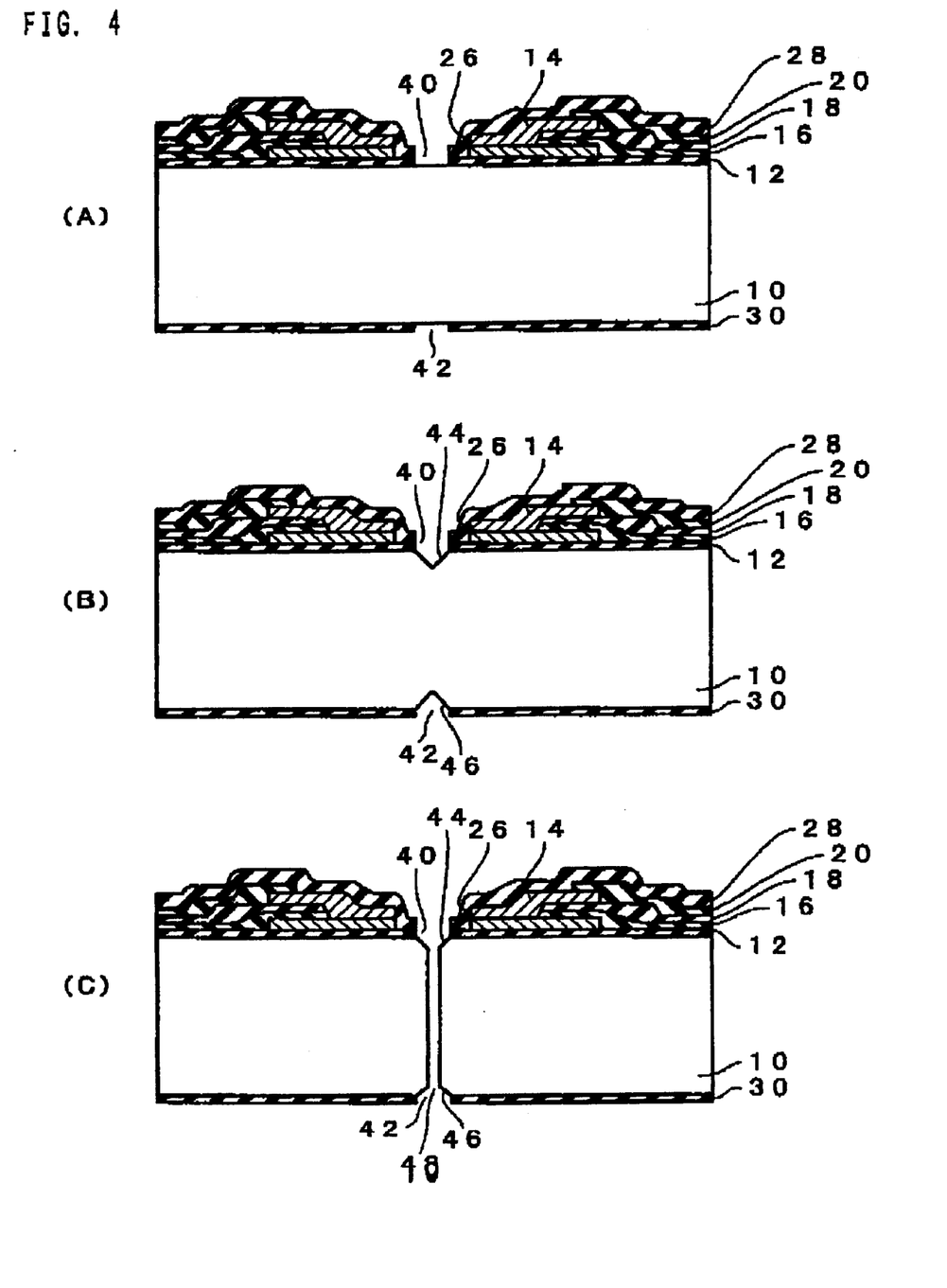

As shown in FIG. 4(A), the resists 32 and 34 are peeled off. Subsequently, as shown in FIG. 4(B), the parts, which have been exposed by the holes 40 and 42, of the semiconductor chip 10 are etched. These parts to be etched are the parts on which the integrated circuit has not been formed, and have been formed from silicon. By this etching, dents 44 and 46 likely to be visually recognized are formed on the surface of the semiconductor chip 10. The shapes of the dents 44 and 46 are not specifically limited, and may be the tapered shape or may have a wall surface perpendicular to the surface. As the etching, it is easy to apply wet etching, although dry etching may be applied. The shapes of the dents 44 and 46 are determined depending on the sort of the etching.

As shown in FIG. 4(C), a small hole 48 (for example, about 20 $\mu$m in diameter) is formed in the semiconductor chip 10. The small hole 48 has a diameter smaller than that of the penetration hole 50 described below, and is formed at the center of the penetration hole 50. A laser (for example, a YAG laser and $CO_2$ laser) can be used for forming the small hole 48. The laser beam can be radiated while the positions of the dents 44 and 46 are recognized. The laser beam may be radiated from only one surface of the semiconductor chip 10 so as to form the small hole 48, or the laser beam may be radiated from both surfaces of the semiconductor chip 10 (sequentially or simultaneously). When the laser beam is radiated from both surfaces, the semiconductor chip 10 is less affected.

Figure 5:
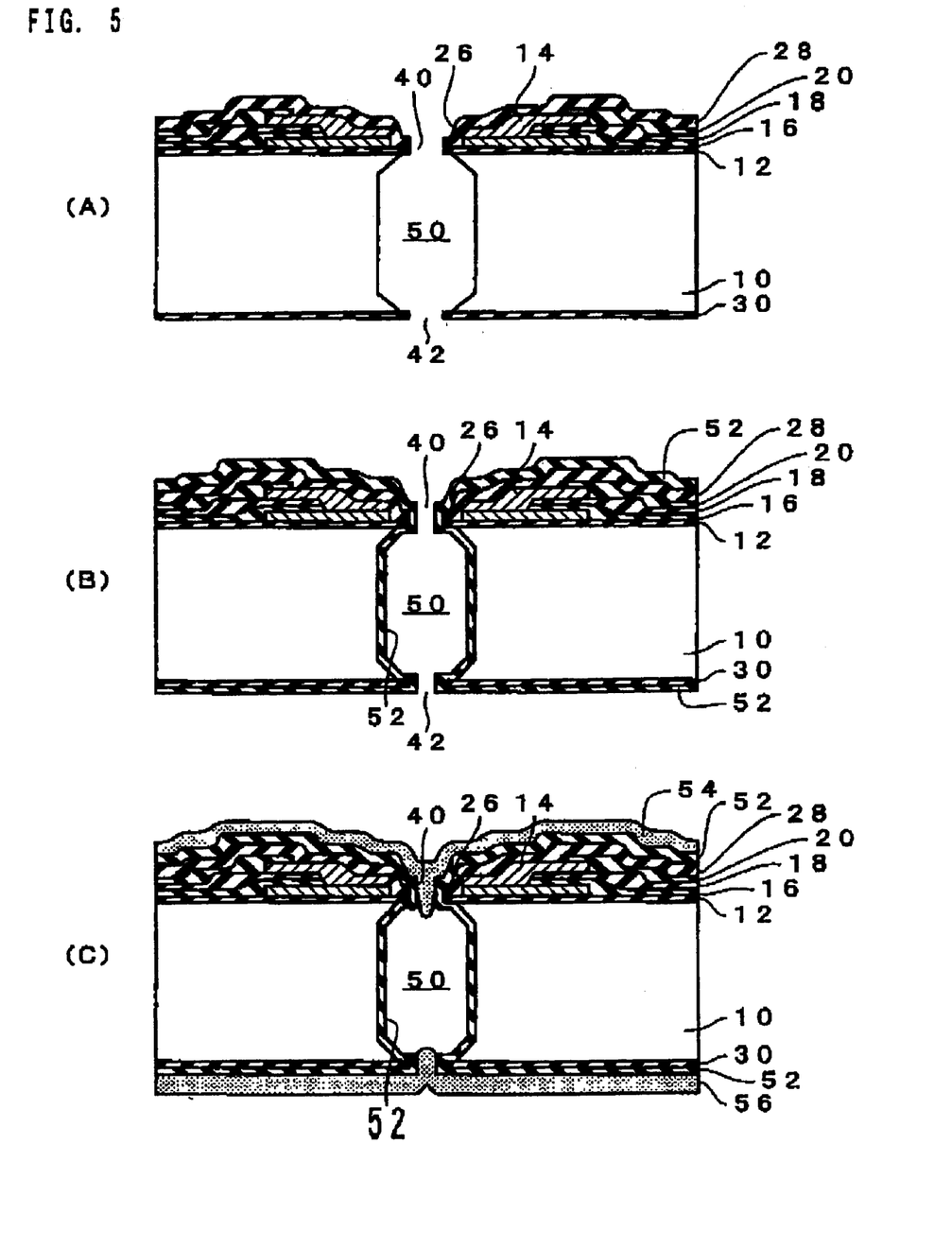

As shown in FIG. 5(A), the penetration hole 50 is formed in the semiconductor chip 10. The penetration hole 50 is formed by enlarging the aforementioned small hole 48. For example, wet etching may be applied and the inner wall surface of the small hole 48 may be etched. As an etchant, for example, an aqueous solution of a mixture of hydrofluoric acid and ammonium fluoride (buffered hydrofluoric acid) may be used.

The penetration hole 50 may be formed in the shape including an open end portion and an intermediate portion having a diameter (for example, about 40 to 50 $\mu$m in diameter) larger than that of the open end portion. When the diameter of the intermediate portion of the penetration hole 50 is made as large as possible, CVD and ink-jet coating of a liquid, which are described below, are performed with ease. The intermediate portion may be formed such that all parts have nearly the same diameter. That is, the inner wall surface of the intermediate portion of the penetration hole 50 may be represented by a straight line in the cross section including the center axis of the penetration hole 50. This shape can be achieved by enlarging the small hole 48 by wet etching. According to this shape, reduction of strength of the semiconductor chip 10 due to formation of the penetration hole 50 can be suppressed. The penetration hole 50 may includes a taper portion connecting the open end portion and the intermediate portion. The taper portion is also formed by enlarging the small hole 48 by wet etching.

As shown in FIG. 5(B), an insulating film 52 is formed on at least the inner wall surface of the penetration hole 50. The CVD may be applied for forming the insulating film 52. When the diameter of the intermediate portion of the penetration hole 50 is larger than the diameter of the open end portion, the CVD is performed with ease. The insulating film 52 may also be formed on the region other than the inner wall surface of the penetration hole 50. For example, the insulating film 52 may be formed on the insulating films 28 and 30. However, the opening of the penetration hole 50 should not be blocked by the insulating film 52.

As shown in FIG. 5(C), the resist 54 is formed on the side, on which the electrode 14 has been formed, of the semiconductor chip 10. The resist 54 is formed while blocking one opening of the penetration hole 50 of the semiconductor chip 10. The content of the aforementioned explanation regarding the resist 22 can be applied to the configuration of the resist 54 and the manufacturing method therefor. When the resist 54 is formed, the resist 56 may be formed on the other side. Subsequently, the resists 54 and 56 are pre-baked.

Figure 6:
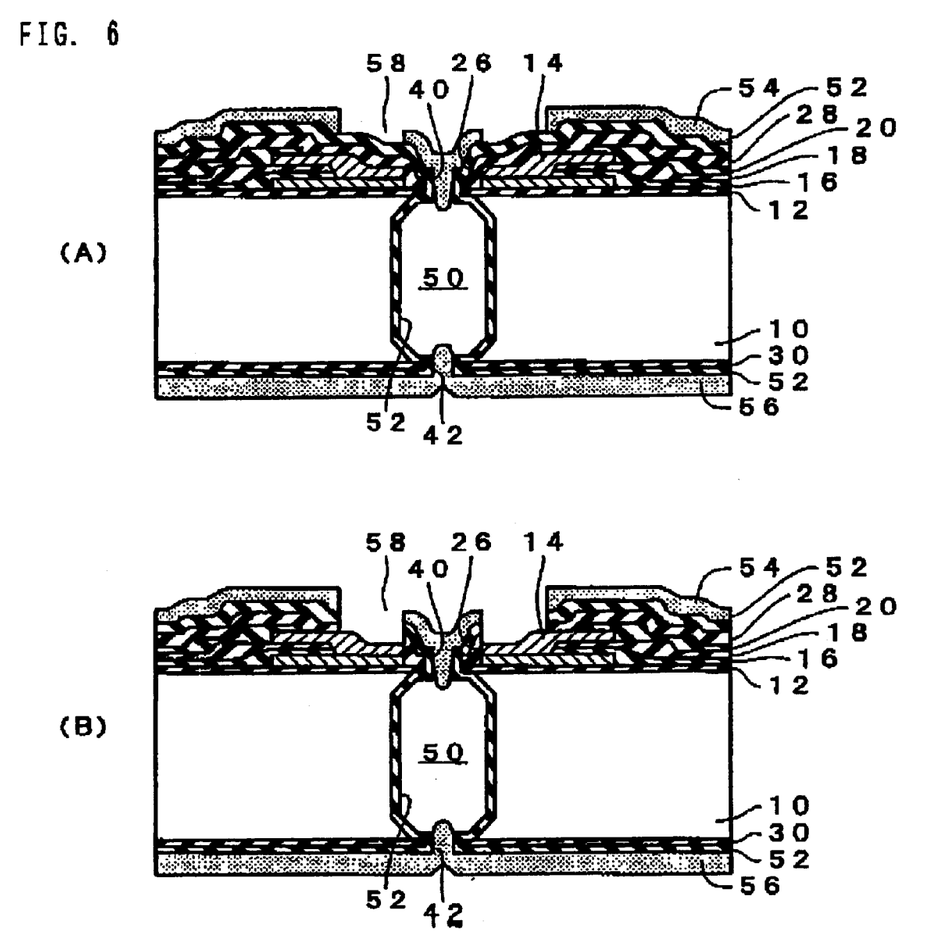
FIG. 6(A) to FIG. 6(B) are diagrams showing the manufacturing method for the semiconductor device according to the embodiment to which the present invention is applied.

As shown in FIG. 6(A), the resist 54 formed on the electrode 14 side is patterned and, therefore, an opening portion 58 is formed. The opening portion 58 is formed above at least a part of the electrode 14. However, a part of the resist 54 is left remaining above the penetration hole 50. For example, the opening portion 58 is formed into the shape of a ring between the outer perimeter in the shape within the range of the electrode 14 and the inner perimeter in the shape covering at least the open end portion of the penetration hole 50. Herein, the shape of a ring may refer to the shape of a rectangular ring or to the shape of a circular ring. The opening portion 58 exposes a part of the insulating film 52. The content of the aforementioned explanation regarding the resist 22 can be applied to the patterning method. After patterning is completed, the resist 54 is developed and is post-baked.

As shown in FIG. 6(B), the insulating films 52 and 28 are etched using the patterned resist 54 as a mask and, therefore, a part of the electrode 14 is exposed. A part of the electrode 14 exposed here is the part to perform electrical connection and, therefore, is preferably large. Thereafter, the resist 54 and 56 are peeled off.

Figure 7:
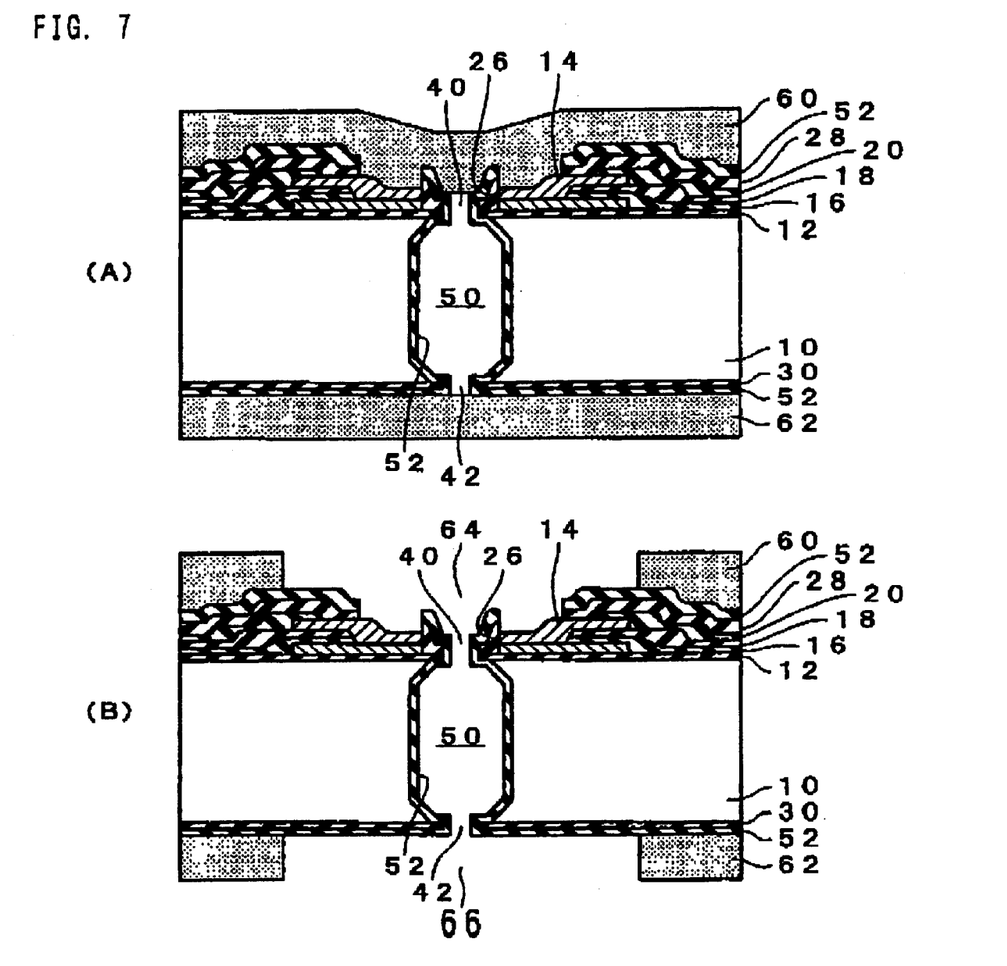
FIG. 7(A) to FIG. 7(B) are diagrams showing the manufacturing method for the semiconductor device according to the embodiment to which the present invention is applied.

As shown in FIG. 7(A), resists 60 and 62 are formed on both sides of the semiconductor chip 10. The resist 60 formed on the side, on which the electrode 14 has been formed, is preferably the one having been made into the shape of a film (dry film) in advance, because it is formed in the region including a large height difference.

As shown in FIG. 7(B), the resist 60 and 62 are patterned, and the resist on the part, on which a conductive layer is formed in a later step, (the part covering the electrode 14, the penetration hole 50, and a part of the insulation layer 52) is left remaining, and the other resist is removed.

Figure 8:
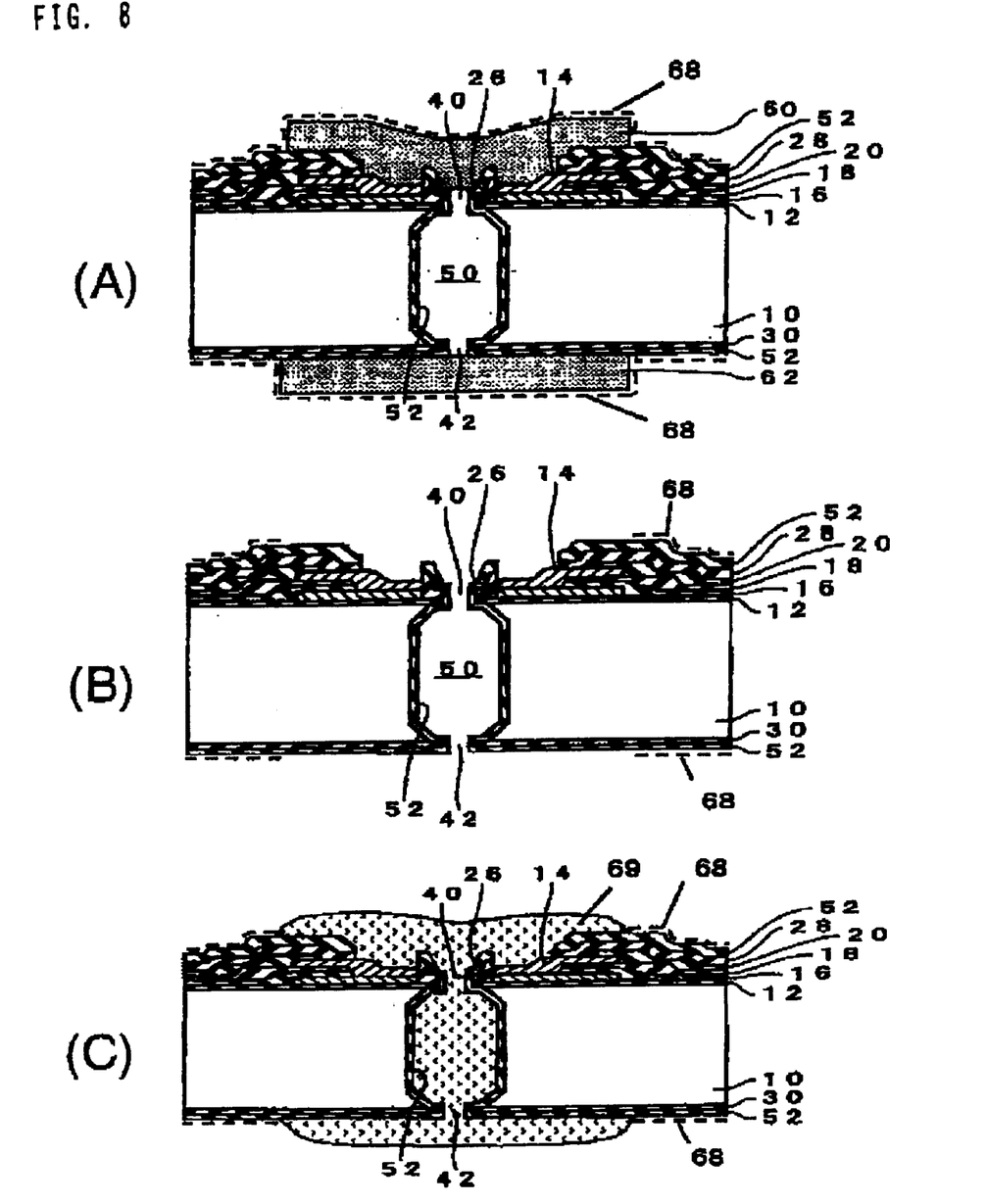

As shown in FIG. 8(A), with respect to the parts from which the resists 60 and 62 have been removed (the parts on which no conductive layer is formed in a later step), a surface treatment is performed in order to impart liquid-repellency against a liquid containing metal fine particles, a coating of which is applied by an ink-jet method described below. This can be achieved by, for example, performing a $CF_4$ plasma treatment at atmospheric pressure. The surface treatment for imparting liquid repellency may use a self-organizing film. In the case where the self-organizing film is used, for example, when on the order of 0.1 g of heptadecafluorotetrahydrodecyltriethoxysilane liquid and the semiconductor chip are put in on the order of 100-liter gastight container, and are maintained at room temperature for on the order of one day or at 100° C. for on the order of one hour, a liquid-repellent self-organizing monomolecular film is formed over the surface of the semiconductor chip.

Thereafter, as shown in FIG. 8(B), the liquid-repellent surfaces 68 formed on the resists 60 and 62 are removed together with the resists. According to this, the electrode 14, the inside of the penetration hole 50, and a part of the insulating film 52, which have been covered with the resists, become lyophilic with respect to the liquid, and the parts, on which no resist has existed, become liquid-repellent with respect to the liquid.

As shown in FIG. 8(c), the liquid 69 containing the metal fine particles is ejected by an ink-jet system, and is placed selectively in the inside of the penetration hole 50, on the electrode 14, and on a part of the insulation layer 52 (lyophilic parts). Herein, even when the flying route of the liquid droplets is curved by a small degree during ejection of the liquid droplets at the ink jet and, therefore, the hit position is deviated, since the parts, on which no conductive layer is formed, have the liquid-repellent surface 68, all liquid droplets fall within the lyophilic parts. The amount of the liquid to be placed in the penetration hole and on the electrode in one region is appropriately controlled depending on the area of the coating region, the size of the penetration hole, the concentration of the liquid, etc., and the liquid is ejected at one coating region in such an order of amount that metal particles continuously cover the inside of the penetration hole and the electrode 14 after drying of the solvent. Adjustment of the amount of the liquid placed at one region can be performed by the size of the liquid droplet ejected by ink jet, the number of ejections, etc. In order to uniformly coat the inside of the penetration hole with the liquid, coating can be performed from both surface of the substrate by the ink-jet method as well. Usually, the size of the liquid droplet ejected from an ink-jet head is on the order of 10 $\mu$m to 100 $\mu$m in diameter. According to the inkjet system, by application of the technique practically used for an ink-jet printer, the coating of the liquid can be economically applied with a high speed and with no waste. Regarding the ink-jet head, for example, those practically used for ink-jet printers, which are of piezo-jet type using a piezoelectric element, of bubble-jet type using an electrothermal transducer as an energy generation element, or the like, can be used, and the ejection area and the ejection pattern can be set arbitrarily. According to this, an electrical-connection portion can be formed without performing the resist patterning step and the resist peeling step.

Herein, as the liquid containing metal fine particles ejected by the ink-jet system, for example, the one in which ultrafine particles of gold, silver, copper, etc., are dispersed in the liquid, can be used. As the solvent, an organic solvent, water, or other arbitrary one can be used. Examples of commercially available liquid, in which ultrafine particles of gold are dispersed in an organic solvent, include a trade name "Perfect Gold" manufactured by VACUUM METAL-LURGICAL CO., LTD. These liquids may be used after being adjusted to have a viscosity and a surface tension suitable for ink jet ejection by adding a proper solvent or surface tension regulator.

After the liquid is placed in the inside 50 of the penetration hole and on the electrode 14, a first heat treatment for drying and removing the solvent is performed. After the first heat treatment, a second heat treatment for achieving electrical conduction among the metal fine particles is performed generally at on the order of 100° C. to 400° C. for on the order of 10 minutes to one hour. According to this, excellent electrical conductivity and adhesion to the substrate can be achieved.

Subsequently, if necessary, a step of removing the liquid-repellent surface formed by the surface treatment or imparting lyophilic by a surface treatment may be performed. This refers to that regarding the case of the self-organizing monomolecular film, it is possible to remove the monomolecular film by, for example, radiating an ultraviolet ray and, therefore, to impart lyophilic.

Furthermore, an electrical-connection portion 72 may be provided. A part of the conductive layer 70 may become the connection portion 72. In that case, the conductive layer 70 is preferably formed to be thick (for example, about 5 $\mu$m or more).

Figure 9:
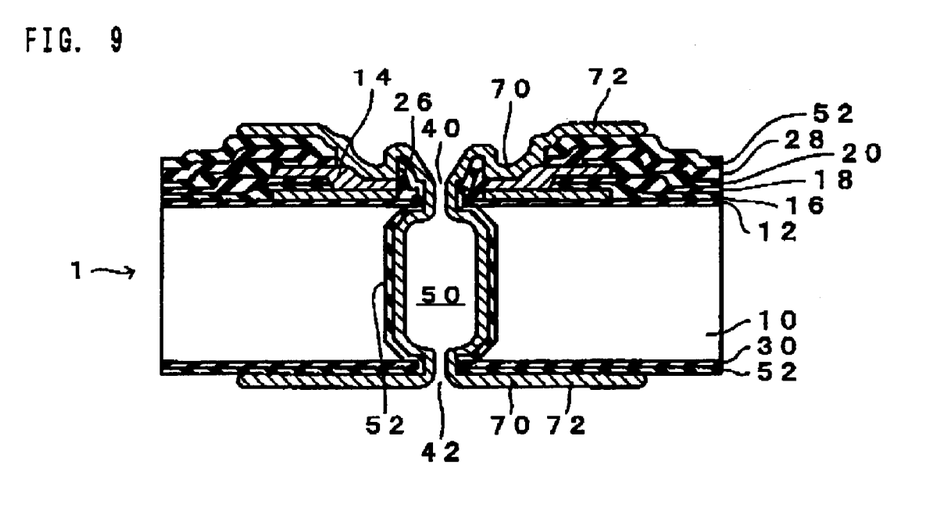
FIG. 9 is a diagram showing a semiconductor device according to an embodiment to which the present invention is applied.

By the aforementioned steps, a semiconductor device shown in FIG. 9(B) can be produced. According to the aforementioned steps, electrical connection between both surfaces of the semiconductor chip 10 can be performed by the conductive layer 70. The semiconductor device 1 has a plurality of electrodes 14, and includes the semiconductor chip 10 with the penetration hole 50 formed therein, and the conductive layer 70 formed in the region including the inside of the penetration hole 50. The shape of the penetration hole 50 is as described above. The conductive layer 70 is formed while being laminated on at least a part of the electrode 14. A part of the conductive layer 70 is made to be the electrical-connection portion 72. In the inside of the penetration hole 50, the insulating film 52 is formed under the conductive layer 70 and, therefore, electrical connection to the integrated circuit formed in the inside of the semiconductor chip 10 is interrupted.

Figure 10:
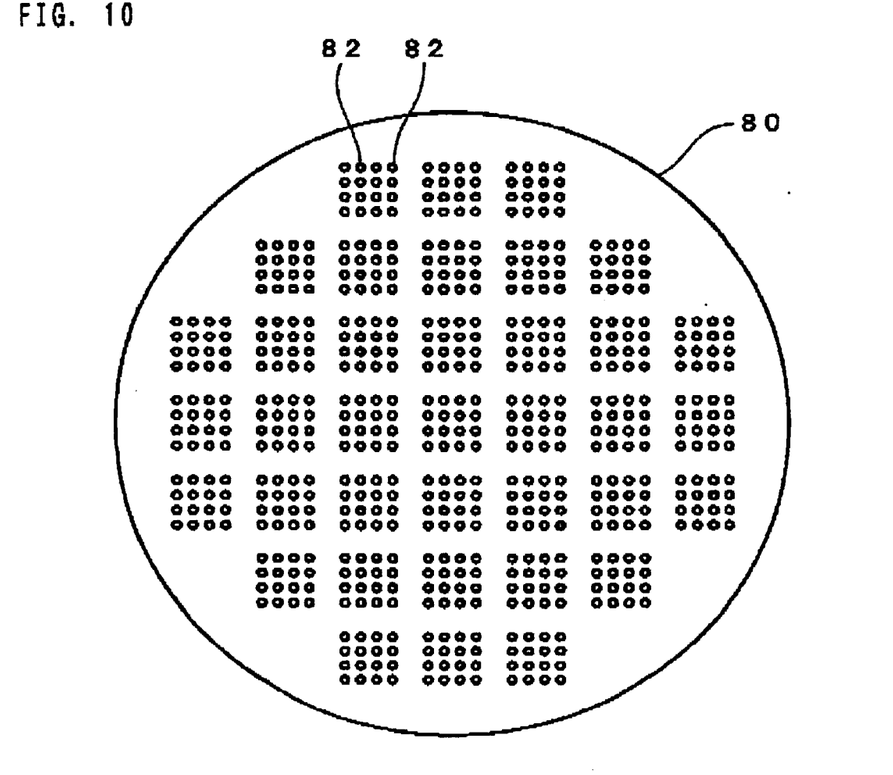
FIG. 10 is a diagram showing a manufacturing method for a semiconductor device according to an embodiment to which the present invention is applied.

Although the aforementioned step has been performed with respect to the semiconductor chip 10, this may be performed with respect to a semiconductor wafer. For example, as shown in FIG. 10, the aforementioned step may be performed with respect to a semiconductor wafer 80 and, therefore, electrical-connection portions 82 may be formed. This semiconductor wafer 80 is subjected to dicing and, therefore, the semiconductor device 1 shown in FIG. 9 can be produced.

Figure 11:
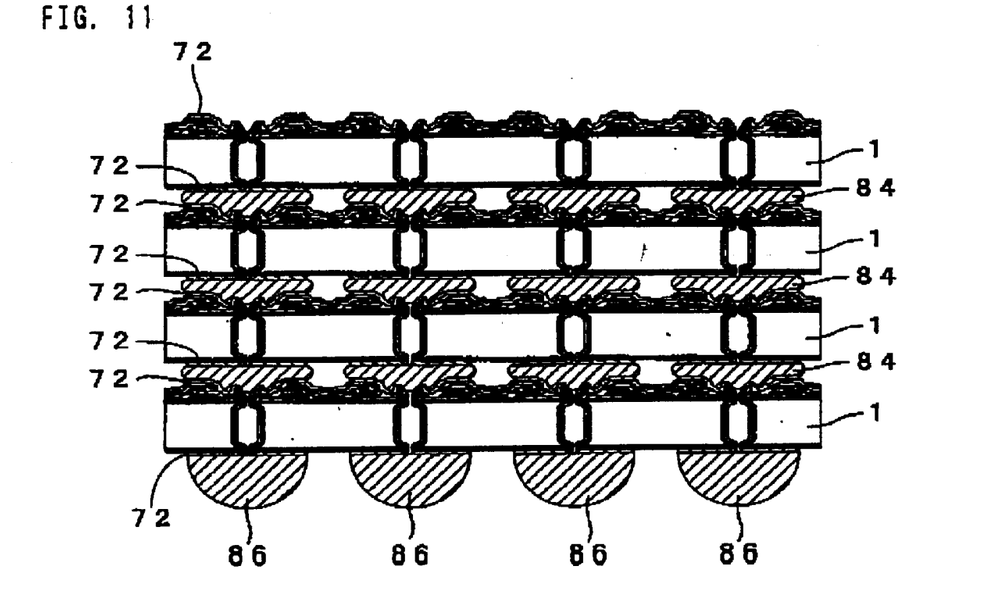
FIG. 11 is a diagram showing another semiconductor device according to an embodiment to which the present invention is applied.

As shown in FIG. 11, a three-dimensional mounting type (stacked type) semiconductor device, in which a plurality of the semiconductor devices 1 are laminated, can also be manufactured. In an example shown in FIG. 11, the connection portions 72 of the upper and lower semiconductor devices 1 are electrically joined with brazing materials 84, for example, solder.

The adhesive may be a liquid or gel adhesive, or be a sheet-shaped adhesive sheet. The adhesive may be the one containing an epoxy resin as a primary material. The adhesive may be the one having an insulation property.

A conductive material may be contained in the adhesive in order to improve performance of electrical connection between materials to be connected. The conductive material is composed of, for example, particles of a brazing material, solder, etc., and those are dispersed in the adhesive material. According to this, during joining between materials to be connected, the particles serve as wax of junction and, therefore, junction property can be further remarkably improved.

The adhesive may be an anisotropically conductive adhesive (ACA) in which conductive particles are dispersed, for example, an anisotropically conductive film (ACF) and an anisotropically conductive paste (ACP). The anisotropically conductive adhesive is the one in which conductive particles (filler) are dispersed in a binder, and a dispersing agent may be added. In many cases, a thermosetting adhesive is used as the binder for the anisotropically conductive adhesive. In that case, conductive particles interpose between a wiring pattern and an electrode and, therefore, electrical connection therebetween can be performed.

Through the use of contraction force of the insulating adhesive, the connection portions 72 may be directly joined to each other and, in addition, the upper and lower semiconductor devices 1 may be attached to each other with an adhesive. In this case, the connection portion 72 is preferably formed in the shape of a bump.

Metal junction by Au—Au, Au—Sn, solder, etc., may be applied to electrical connection between the connection portions 72. For example, both are joined by application of heat alone, ultrasonic vibration alone, ultrasonic vibration and heat, or the like. When joining is performed, the material constituting the connection portions 72 diffuses by vibration or heat and, therefore, metal junction is formed.

External terminals 86 are provided on the connection portions 72 of the semiconductor device 1 at the lowermost (or uppermost) positions. Although the external terminals 86 can be formed from solder, metal, etc., those may be formed from a conductive member. In the present embodiment, the external terminals 86 are solder balls.

The solder ball is not always necessary. The semiconductor device may be mounted on the substrate and, therefore, a semiconductor module may be configured. Furthermore, no solder ball may be formed, a solder cream, which is applied to a motherboard side by coating during mounting of the motherboard, may be used, and electrical-connection portion may be formed by surface tension during melting thereof.

A plurality of semiconductor wafers 80, in which the aforementioned steps have been performed, shown in FIG. 10 may be laminated, each connection portion 82 may be electrically connected and, thereafter, dicing may be performed so as to manufacture the semiconductor device shown in FIG. 11.

Figure 12:
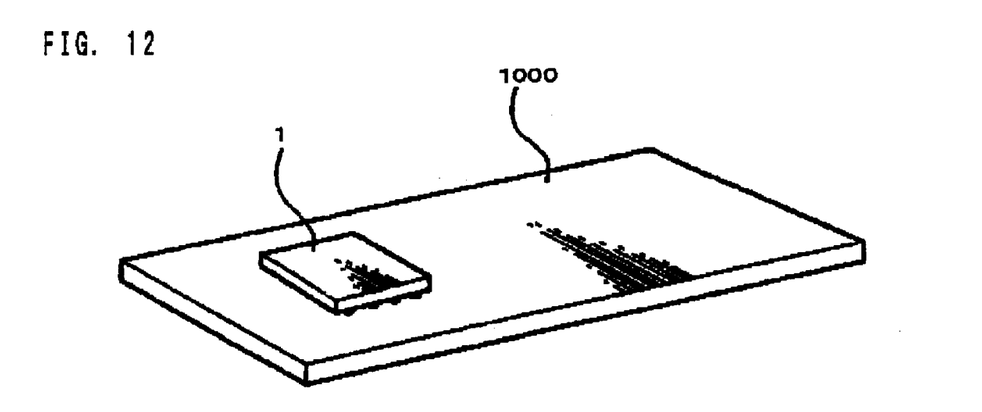
FIG. 12 is a diagram showing a circuit substrate on which a semiconductor device according to the present embodiment is mounted.

FIG. 12 shows a circuit substrate 1000 on which the semiconductor device 1 according to the present embodiment is mounted. In general, an organic substrate, for example, glass epoxy substrate, is used for the circuit substrate 1000. A wiring pattern made of, for example, copper is formed on the circuit substrate 1000 in order to become a desired circuit, those wiring patterns and the connection portions 72 of the semiconductor device 1 are mechanically connected and, therefore, electrical communication therebetween is performed.

Figure 13:
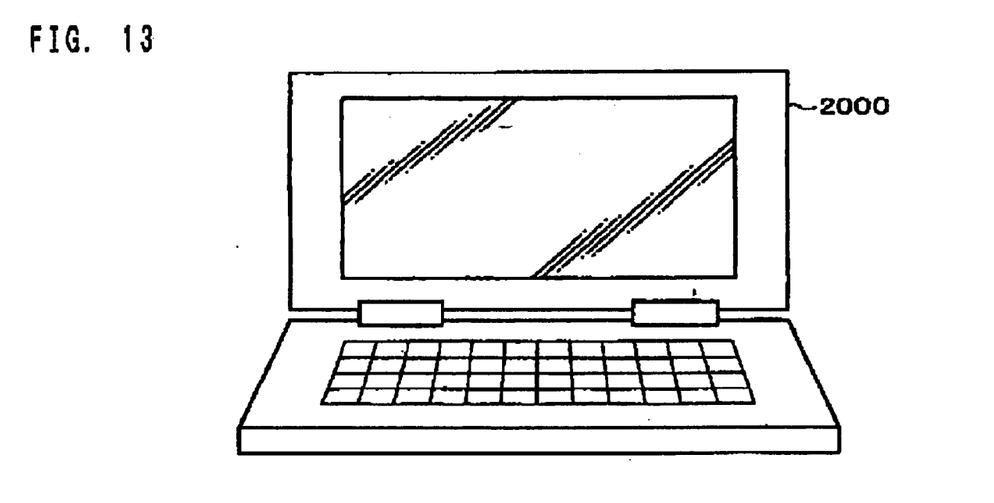
FIG. 13 is a diagram showing electronic apparatus including a semiconductor device according to the present embodiment.
Figure 14:
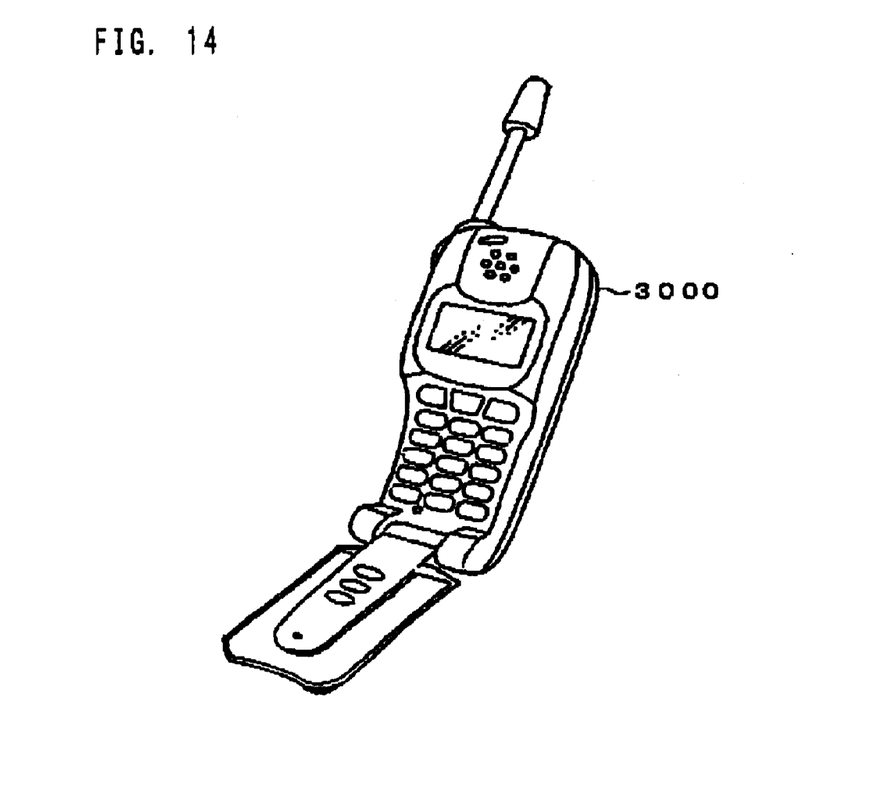
FIG. 14 is a diagram showing electronic apparatus including a semiconductor device according to the present embodiment.

As electronic apparatus including the semiconductor device 1 to which the present invention is applied, a note type personal computer 2000 is shown in FIG. 13, and a cellular phone 3000 is shown in FIG. 14.

In the aforementioned embodiments, "semiconductor chip" may be replaced with "electronic element" and, therefore, electronic components can be manufactured. Examples of electronic components manufactured using such an electronic element include, for example, optical elements, resistors, condensers, coils, oscillators, filters, temperature sensors, thermistors, varistors, volumes, and fuses.

What is claimed is:

1. A manufacturing method for a semiconductor device, comprising:
   forming a penetration hole in a semiconductor element having an electrode; and
   forming a conductive layer in a region including an interior of the penetration hole, the conductive layer being manufactured by:
      coating a part of the semiconductor element with a liquid containing metal fine particles by an ink-jet method, and
      converting the liquid into the conductive layer by heat treatment.

2. The manufacturing method for a semiconductor device according to claim 1, further including forming a hole that communicates with the penetration hole in the electrode, and forming the conductive layer while being laminated on at least a part of the electrode.

3. The manufacturing method for a semiconductor device according to claim 1, further including forming the penetration hole in a shape including an open end portion and an intermediate portion having a diameter that is larger than a diameter of the open end portion.

4. The manufacturing method for a semiconductor device according to claim 3, further including forming the intermediate portion in order that all parts have nearly the same diameter, and forming the penetration hole in a shape further including a taper portion connecting the open end portion and the intermediate portion.

5. The manufacturing method for a semiconductor device according to claim 1, the step of forming a penetration hole including forming a small hole having a diameter that is smaller than a diameter of the penetration hole in advance, and enlarging the small hole so as to form the penetration hole.

6. The manufacturing method for a semiconductor device according to claim 5, the step of forming a penetration hole including forming a dent at the position at which the penetration hole is to be formed, and forming the small hole in accordance with positioning based on the dent.

7. The manufacturing method for a semiconductor device according to claim 5, further including forming the small hole with a laser beam, and enlarging the small hole by wet etching.

8. The manufacturing method for a semiconductor device according to claim 1, further including forming an electrical-connection portion.

9. The manufacturing method for a semiconductor device according to claim 8, the step of forming a conductive layer including forming the connection portion as a part of the conductive layer.

10. The manufacturing method for a semiconductor device according to claim 1, further including forming an insulating film on the interior wall surface of the penetration hole after the step of forming a penetration hole and before the step of forming a conductive layer, and the step of forming a conductive layer includes forming the conductive layer on the insulating film.

11. The manufacturing method for a semiconductor device according to claim 10, further including forming the insulating film by chemical vapor deposition.

12. The manufacturing method for a semiconductor device according to claim 1, further including performing a surface treatment, in which the region with no coating of the liquid is made liquid-repellent against the liquid, after the step of forming a penetration hole and before the step of forming a conductive layer.

13. The manufacturing method for a semiconductor device according to claim 12, further including performing the surface treatment via an atmospheric plasma treatment.

14. The manufacturing method for a semiconductor device according to claim 12, further including performing the surface treatment by forming a self-organizing film on the surface.

15. The manufacturing method for a semiconductor device according to claim 1, further including manufacturing the semiconductor element to be a semiconductor chip.

16. The manufacturing method for a semiconductor device according to claim 1, further including manufacturing the semiconductor element to be a part of a semiconductor wafer.

17. A manufacturing method for a semiconductor device, comprising:

laminating semiconductor devices manufactured by the method according to claim 1, the semiconductor device including upper and lower semiconductor devices; and electrically connecting conductive layers in the upper and lower semiconductor devices.

18. The manufacturing method for a semiconductor device according to claim 16, further including cutting the semiconductor wafer into individual pieces.

19. A semiconductor device manufactured by the method according to claim 1.

20. A circuit substrate structure, comprising:

a circuit substrate; and the semiconductor device manufactured by the method according to claim 1 mounted on the circuit substrate.

21. An electronic apparatus, comprising:

the semiconductor device manufactured by the method according to claim 1.

* * * * *